(12) United States Patent
Kato et al.

(10) Patent No.: US 6,533,948 B2
(45) Date of Patent: Mar. 18, 2003

(54) METHOD OF MANUFACTURING SEMICONDUCTOR DEVICE HAVING FERRO-DIELECTRIC MATERIAL FILM

(75) Inventors: Yoshikazu Kato, Mizusawa (JP); Koji Tani, Mizusawa (JP); Takanori Hashimoto, Iruma (JP)

(73) Assignee: Fujitsu Limited, Kawasaki (JP)

( * ) Notice: Subject to any disclaimer, the term of this patent is extended or adjusted under 35 U.S.C. 154(b) by 88 days.

(21) Appl. No.: 09/790,498

(22) Filed: Feb. 23, 2001

(65) Prior Publication Data

US 2001/0017285 A1 Aug. 30, 2001

(30) Foreign Application Priority Data

Feb. 25, 2000 (JP) ........................................ 2000-050200

(51) Int. Cl.⁷ .................................................. H01G 4/00
(52) U.S. Cl. ........................... 216/6; 216/100; 216/101; 216/108; 438/3
(58) Field of Search ............................. 216/6, 83, 100, 216/101, 108; 438/3

(56) References Cited

U.S. PATENT DOCUMENTS

| 5,481,490 A | 1/1996 | Watanabe et al. ............ 365/145 |
| 5,515,984 A | 5/1996 | Yokoyama et al. ............ 216/41 |
| 5,776,356 A * | 7/1998 | Yokoyama et al. ............ 216/76 |

FOREIGN PATENT DOCUMENTS

| JP | 7-111318 | 4/1995 |
| JP | 8-45905 | 2/1996 |

* cited by examiner

*Primary Examiner*—Anita Alanko
(74) *Attorney, Agent, or Firm*—Armstrong, Westerman & Hattori, LLP (57) ABSTRACT

A reaction byproduct which is generated when a ferro-dielectric material film is etched is removed without giving adverse effect on the semiconductor element. After the etching of the ferro-dielectric material film, a wetting process may performed using an aqueous solution of phosphoric acid. After the ferro-dielectric material film is etched using the resist as the mask, the wetting process is also performed using the aqueous solution of phosphoric acid before and after the ashing of resist.

10 Claims, 12 Drawing Sheets

METHOD OF MANUFACTURING SEMICONDUCTOR DEVICE HAVING FERRO-DIELECTRIC MATERIAL FILM

BACKGROUND OF THE INVENTION

1. Field of the Invention

The present invention relates to a method of manufacturing a ferro-dielectric material capacitor and particularly to a method of manufacturing a ferro-dielectric material capacitor to be used in FeRAM (Ferroelectric Random Access Memory).

2. Description of Related Art

In these years, attention is paid to a FeRAM using a ferro-dielectric material film because of its excellent performance such as non-volatility and quick access time.

Figure 10A:
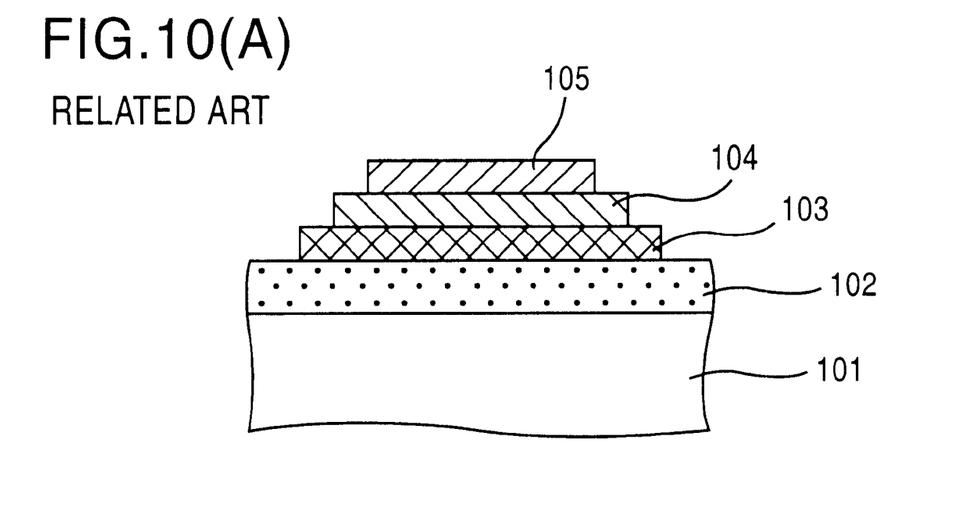
FIGS. 10(A) and (B) are schematic cross-sectional views illustrating the ferro-dielectric material capacitor structure of the related art.

FIG. 10(A) schematically illustrates a cross-sectional structure of a ferro-dielectric material capacitor used in the FeRAM of the related art. In this figure, 101 designates a silicon substrate; 102, an insulation film used for element isolation or interlayer insulation; 103, a lower electrode of capacitor formed on the insulation film; 104, a ferro-dielectric material capacitor insulation film; 105, an upper electrode of capacitor.

In general, since oxygen easily becomes reduced in amount in the ferro-dielectric material film due to the process using the reduction atmosphere in the FeRAM manufacturing process, the annealing process in the oxidation atmosphere must be conducted adequately in the course of the process.

In this case, if the upper electrode and lower electrode are oxidized and an oxide film is formed thereon, a dielectric coefficient of the capacitor insulation film of the ferro-dielectric material capacitor as a whole is lowered and the ferro-dielectric characteristic is also deteriorated as represented by deterioration of the polarizing characteristic.

In view of solving such disadvantage, a film of noble metal such as Pt which is not easily oxidized and a film of Ir and Ru which does not lose conductivity when it is oxidized are used as the lower electrode and upper electrode in FeRAM.

The structure of the capacitor insulation film illustrated in FIG. 10(A) is formed in the following processes.

First, Pt as the lower electrode material of the capacitor, PZT as the ferro-dielectric material and Pt film as the upper electrode material are sequentially formed on the insulation film 102 such as a silicon oxide film formed on the silicon substrate 101.

Next, the upper electrode material is etched to form an upper electrode 105 by the dry etching method using the resist formed in the shape of a pattern of the upper electrode as the mask.

Next, after removing the resist by ashing it using the plasma of gas including oxygen, the resist film is formed in the shape of a pattern of the capacitor insulation film and this resist film is used as the mask to form the capacitor insulation film 104 by etching such ferro-dielectric material with the dry etching method.

Next, the resist film that has been used as the mask is removed by ashing it using the plasma of the gas including oxygen and subsequently, the resist film is formed in the shape of a pattern of the lower electrode. This resist film is then used as the mask to perform the etching of layer 103a (FIG. 10B) by the dry etching method to form the lower electrode 103. Thereafter, the resist film used as the mask is removed with the ashing process.

Figure 10B:
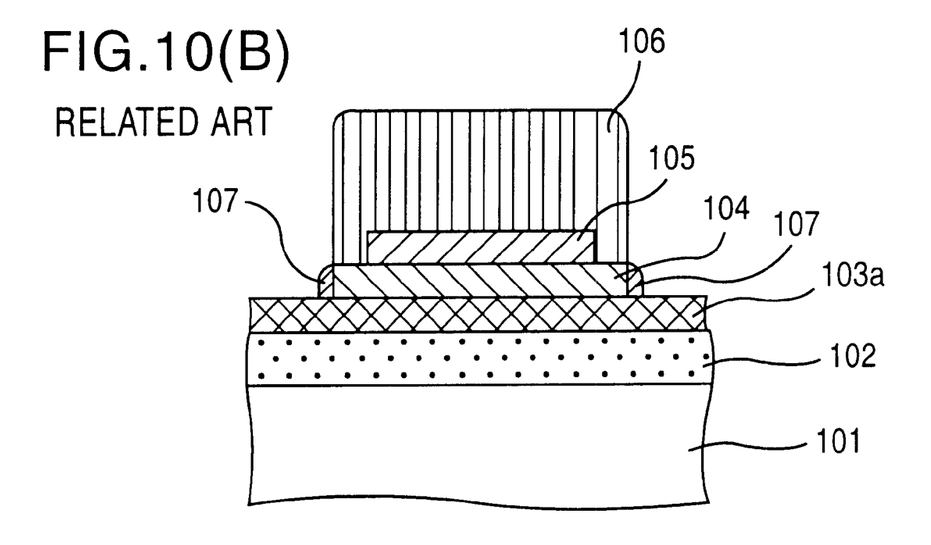

FIG. 10(B) is given to explain the problems in the method of forming the capacitor structure explained above. As illustrated in FIG. 10(B), when the ferro-dielectric material is etched with the dry-etching method using a mask 106 such as the resist, a reactive byproduct 107 is generated. Such byproduct will cause a leak of that capacitor and also gives adverse effect on the element, for example, it will cause an irregular pattern when it is peeled in the post-process and therefore such byproduct 107 must be removed after the etching process.

As a method of removing such reaction byproduct, a method of using hydrochloric acid and nitric acid and a method of using organic solvent have been proposed.

However, when such hydrochloric acid and nitric acid are used, the etching rate of the ferro-dielectric material as the capacitor insulation film is high and therefore it is difficult to control the amount of etching, resulting in the problem that the ferro-dielectric material has been etched too much. Particularly, while the element is micro-miniaturized, such reduction of the film has become a serious problem.

Moreover, in the method of using an organic solvent, a problem that the ferro-dielectric material is etched does not occur, but it has become apparent that a problem that such organic solvent penetrates into the area between the ferro-dielectric material film and the lower electrode of Pt, Ir, Ru or the like to provide peeling of the ferro-dielectric material film.

Moreover, it is considered, as the other approach to remove the reaction byproduct, to make it difficult to deposit the reaction byproduct or make it easier to remove the reaction byproduct by forming a tapered shape of the cross-section of the ferro-dielectric material film after the etching process. However, even when such cross-section is formed into the shape which is a little tapered, it is impossible to attain the effect to prevent deposition of the reaction byproduct and it has been difficult to obtain the desired tapered shape with good controllability while satisfying various properties such as selection ratio of the etching for the lower electrode, shape distribution within the wafer and productivity influenced by the etching rate.

SUMMARY OF THE INVENTION

The present invention discloses a method that has solved the problems explained above and can remove reaction byproduct after removing the ferro-dielectric material film with good controllability.

The problems explained above can be solved by etching the ferro-dielectric material film formed on a semiconductor substrate and thereafter such ferro-dielectric material film is wetted with an aqueous solution of phosphoric acid.

In this case, a resist may be used as the etching mask and the problem can be solved with the wet processing using the phosphoric acid after the resist ashing process.

Particularly, when the resist is used as the mask, the reaction byproduct, when it is produced in a large amount, can be removed successfully by conducting the wet process using the aqueous solution of phosphoric acid before and after the resist ashing process.

Figure 11:
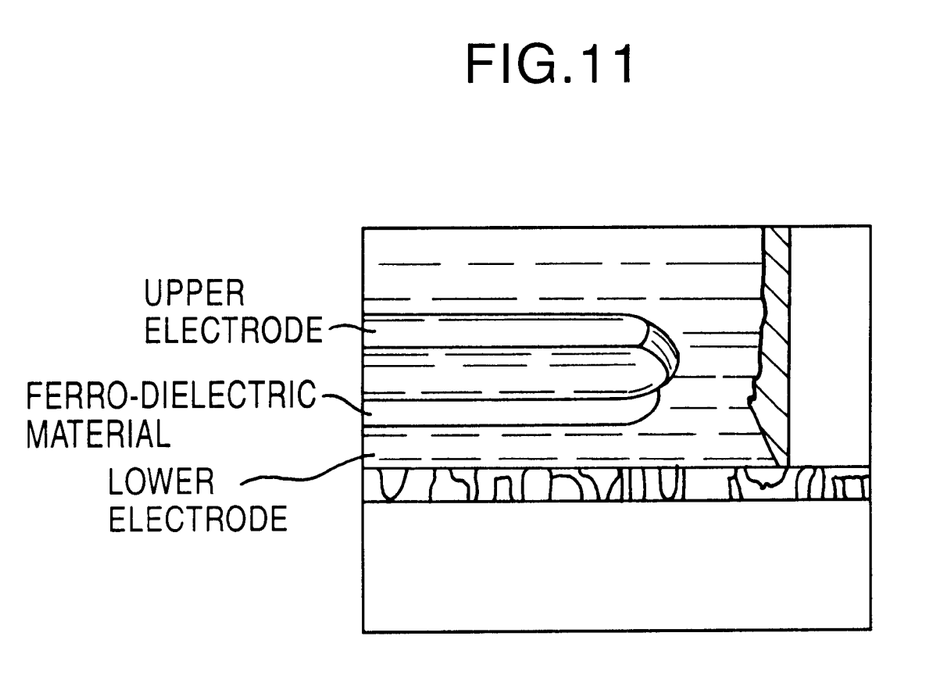
FIG. 11 is a schematic diagram illustrating the capacitor structure after the hydrochloric acid process.

FIG. 11 is a schematic illustration of the capacitor structure after the process using hydrochloric acid. This schematic illustration is drawn based on the SEM photograph of the cross-section of the capacitor structure after the process using the hydrochloric acid. The PZT film is formed as the ferro-dielectric material on the Pt lower layer electrode and the PZT film is etched into the shape of the capacitor insulation film by the dry etching method using the resist as the mask. Thereafter, the resist is removed with the ashing process in the gas atmosphere including oxygen and fluorine and thereafter the process using the hydrochloric acid has been conducted.

As will be understood from the figure, the PZT film is reduced to a large extent by the process using the hydrochloric acid and the etching is conducted in such a degree to form up-diffusion with the upper electrode. It is also true when nitric acid is used. Here, the processing conditions such as concentration or the like have been searched to find out that there is no difference in very large etching rate of the PZT film and remarkable reduction of film.

Figure 12A:
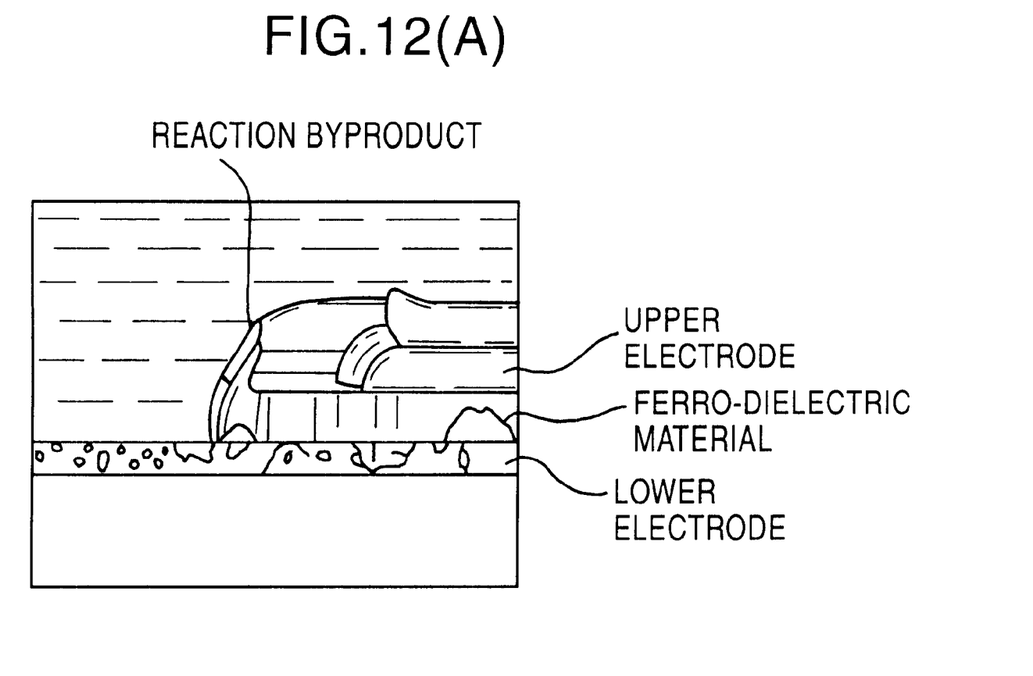
FIGS. 12(A) and (B) are schematic diagrams illustrating the capacitor structure before and after the phosphoric acid process.
Figure 12B:
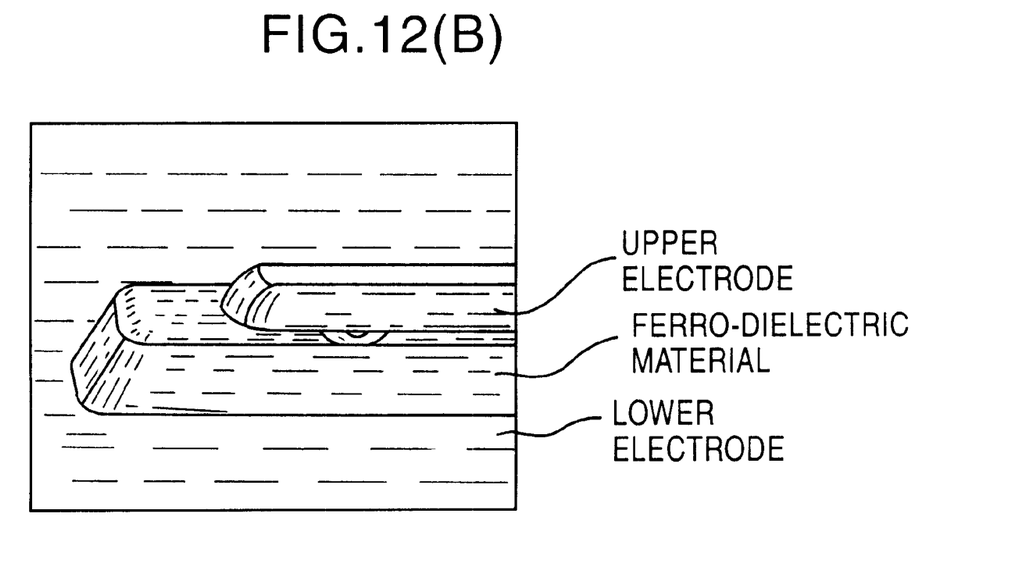

FIGS. 12(A) and 12(B) schematically illustrate the capacitor structure before and after the process using phosphoric acid. This schematic illustration is drawn based on the SEM photograph of the cross-section. As in the case of the experiment of the hydrochloric acid process, the conditions of cross-section of the capacitor structure after the resist ashing removal and after subsequent phosphoric acid process, following the etching of the PZT film into the shape of the capacitor insulation film, are illustrated.

As will be understood from this figure, the reaction byproduct can be removed perfectly by using phosphoric acid. Moreover, as illustrated in FIG. 11, reduction of PZT film cannot be observed. Accordingly, the reaction byproduct due to the etching of the capacitor insulation film material can be removed without resulting in the influence on the capacitor shape particularly, capacitor insulation film) by introducing the phosphoric acid process.

BRIEF DESCRIPTION OF THE DRAWINGS

FIGS. 2(A) and (B) are schematic cross-sectional views for explaining the first embodiment of the present invention.

DETAILED DESCRIPTION OF THE INVENTION

According to the present invention, the reaction byproduct generated in the etching process can be removed without giving adverse effect such as reduction of thickness of the ferro-dielectric material film and separation of the same film by performing the wetting process using an aqueous solution of phosphoric acid.

The first embodiment of the present invention will be explained with reference to the schematic cross-sectional views of FIG. 1 to FIG. 8. In the present embodiment, the present invention is applied to the capacitor forming process of FeRAM.

Figure 1A:
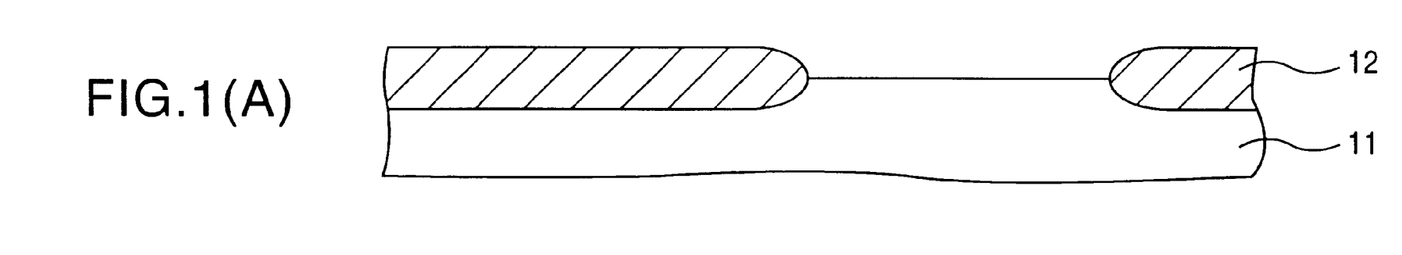
FIGS. 1(A) and (B) are schematic cross-sectional views for explaining the first embodiment of the present invention.

As illustrated first in FIG. 1(A), a field oxide film 12 is formed on a p-type silicon substrate 11 with the known process. This field oxide film may be formed with LOCOS (LOCal Oxidation of Silicon) and may also be formed with a shallow trench isolation method.

Moreover, although not illustrated, ion injection for channel-cut used for element isolation, formation of well to obtain the predetermined transistor characteristic and channel-doped ion injection may be performed at this timing.

Figure 1B:
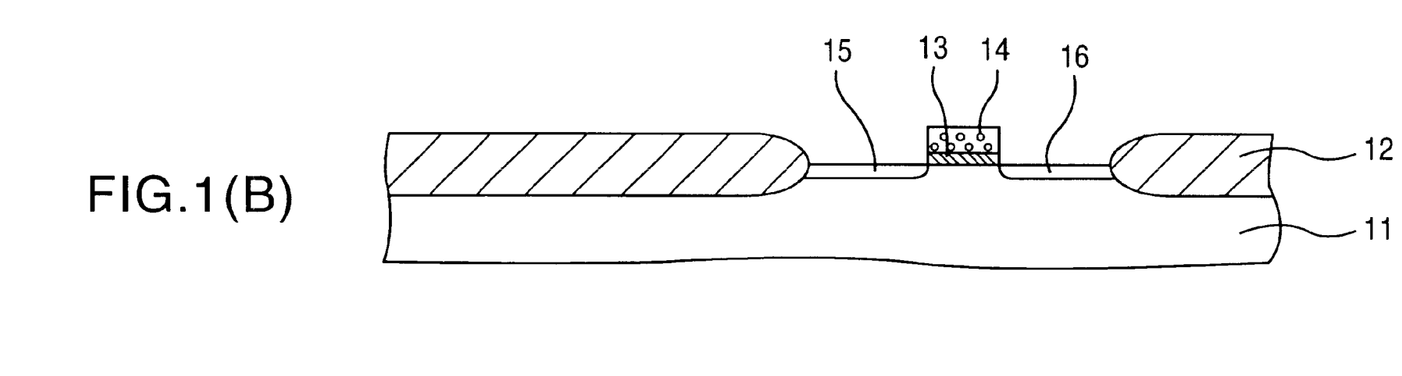

Next, as illustrated in FIG. 1(B), the silicon oxide film and n-type impurity-doped silicon film are sequentially formed in the active area defined with the field oxide film 12, and are then patterned to form the gate insulation film 13 and the gate electrode 14.

Subsequently, a low-concentration n-type impurity (for example, P of $3 \times 10^{13}$ cm$^{-2}$) is ion-injected at an acceleration energy of 60 keV into the silicon substrate 1 using the gate electrode 14 as the mask and thereby the diffused layer areas 15, 16 which will become the low-concentration n-type source•drain diffused layers of LDD are formed in the active area.

Figures 2A, 2B:
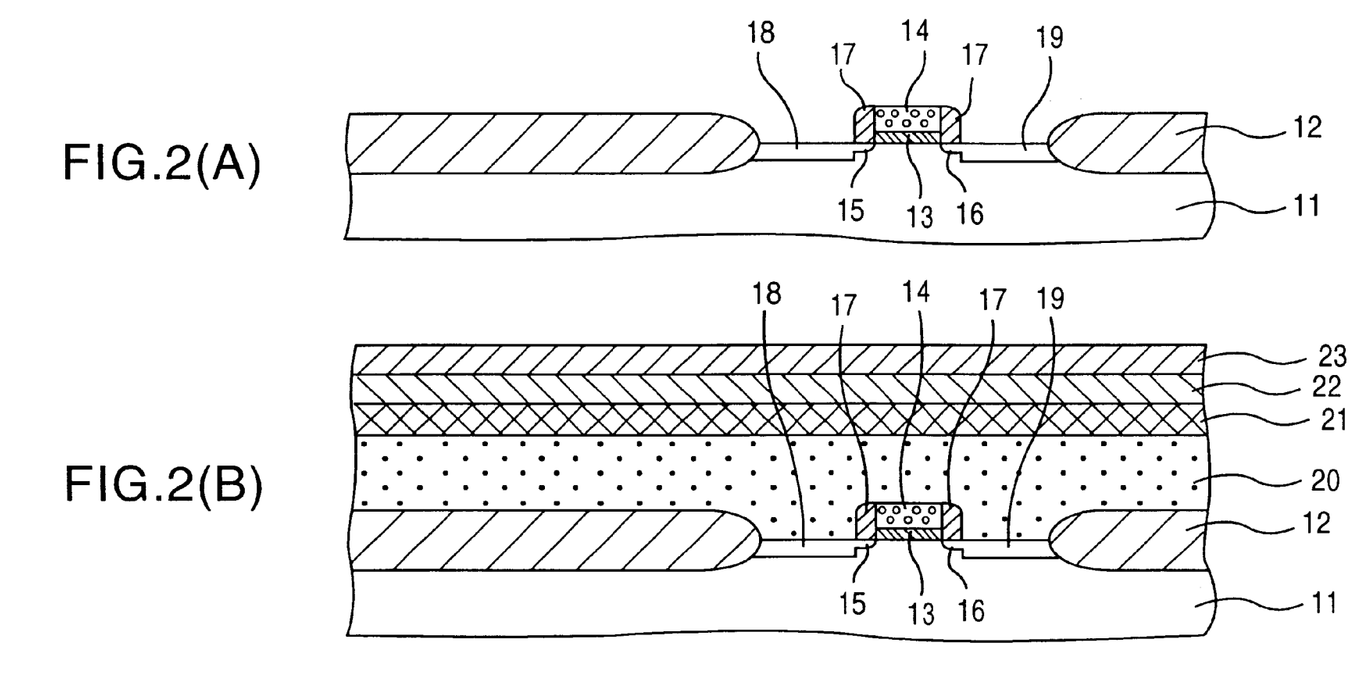

Next, as illustrated in FIG. 2(A), a side wall insulation film 17 is formed at the side wall of the gate electrode 14 through anisotropic etching after the formation of silicon oxide film.

Subsequently, a high concentration n-type impurity (for example, As of $1 \times 10^{15}$ cm$^{-2}$) is ion-injected at an acceleration energy of 50 keV into the silicon substrate 11 with the gate electrode 14 and side wall insulation film 17 used as the mask to form, within the active area, the diffused layer regions 18, 19 which will become the high concentration n-type source•drain diffused layer of LDD.

In the ion injection to form the diffused layer explained above, influence of contamination due to the ion injection can be prevented by previously forming a silicon oxide film or the like on the silicon substrate in the active region and then injecting the ions through these films.

Next, as illustrated in FIG. 2(B), the silicon oxide film 20 is formed by the CVD method and then the film is flattened using CMP (Chemical Mechanical Polishing). Thereafter, a double-layer structure consisting of a lower layer of Ti in the thickness of 20 nm and an upper layer of Pt in the thickness of 180 nm as the lower layer electrode material 21, a layer of PZT of 300 nm as the ferro-dielectric material 22, and a double-layer structure consisting of a Pt layer of 180 nm as a lower layer and a Ti layer of 20 nm as an upper layer of the upper electrode material 23 are respectively formed by sputtering.

Figure 3:
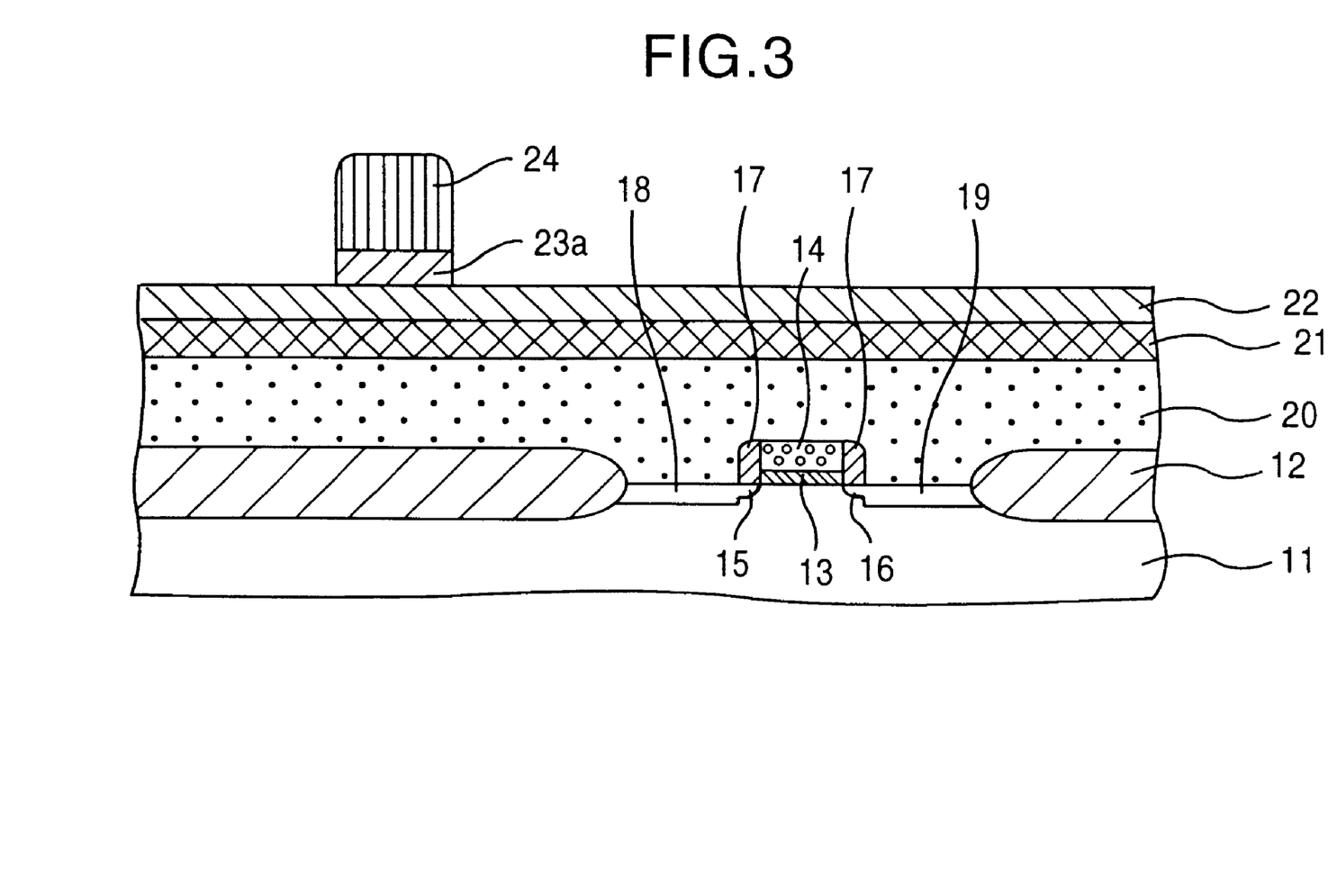
FIG. 3 is a schematic cross-sectional view for explaining the first embodiment of the present invention.

Next, as illustrated in FIG. 3, after the resist 24 is formed leaving the upper electrode forming region, the double-layer structure of Ti and Pt is etched by dry etching with the RIE method using the mixed gas of Ar and Cl$_2$ in view of forming the upper electrode 23a.

Figure 4:
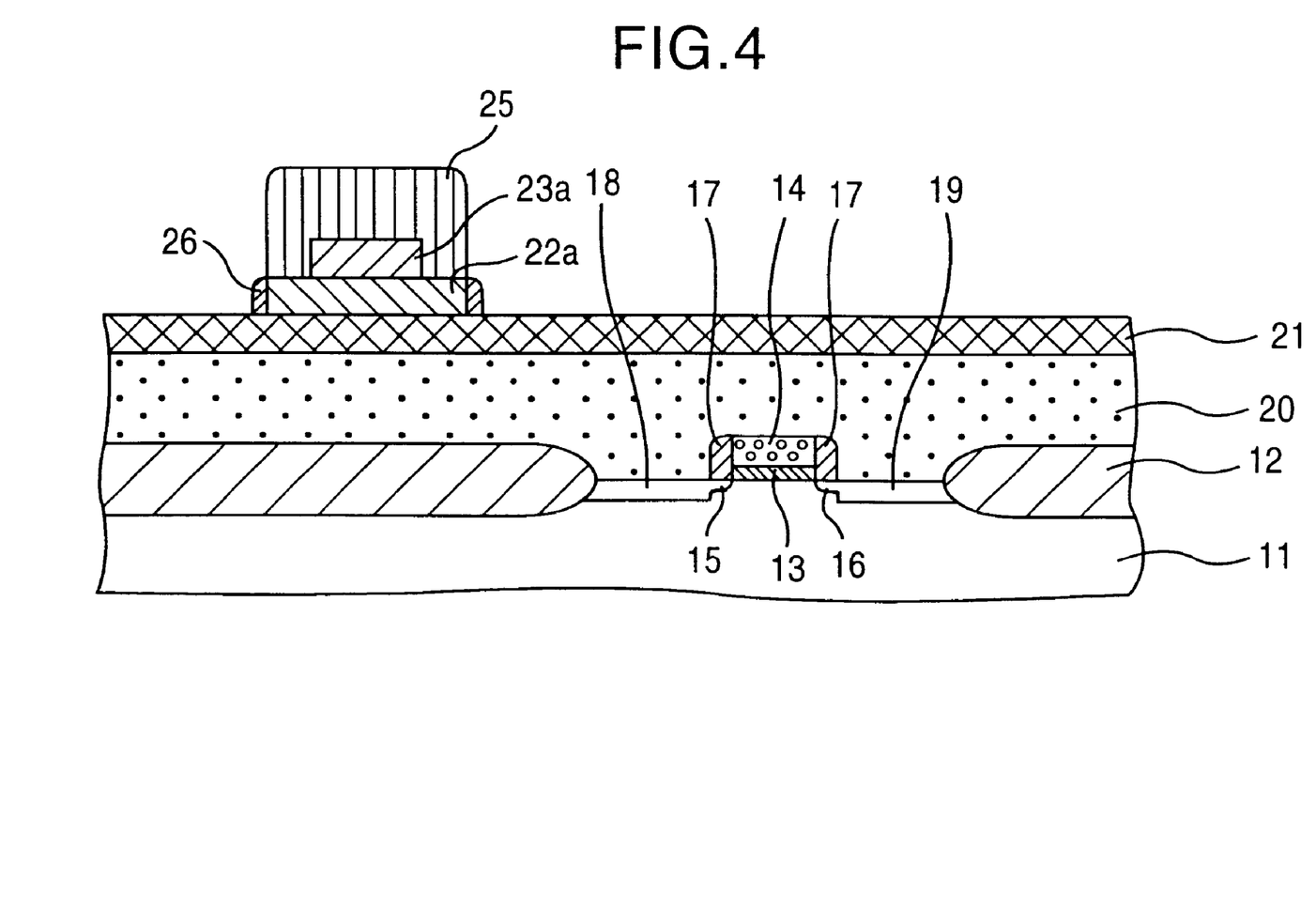
FIG. 4 is a schematic cross-sectional view for explaining the first embodiment of the present invention.

Next, as illustrated in FIG. 4, after the resist 24 is removed with the ashing process using the oxygen plasma, it is then processed using the separation liquid consisting of an organic solvent.

Subsequently, the resist 25 is formed leaving the capacitor insulation film forming region and the capacitor ferro-dielectric film 22a is formed by etching the PZT 22 with the RIE method using the mixed gas of $CF_4$ and Ar with the resist 25 used as the mask. In this case, the reaction byproduct 26 generated at the time of etching is deposited on the side wall of the capacitor ferro-dielectric film 22a.

Figure 5:
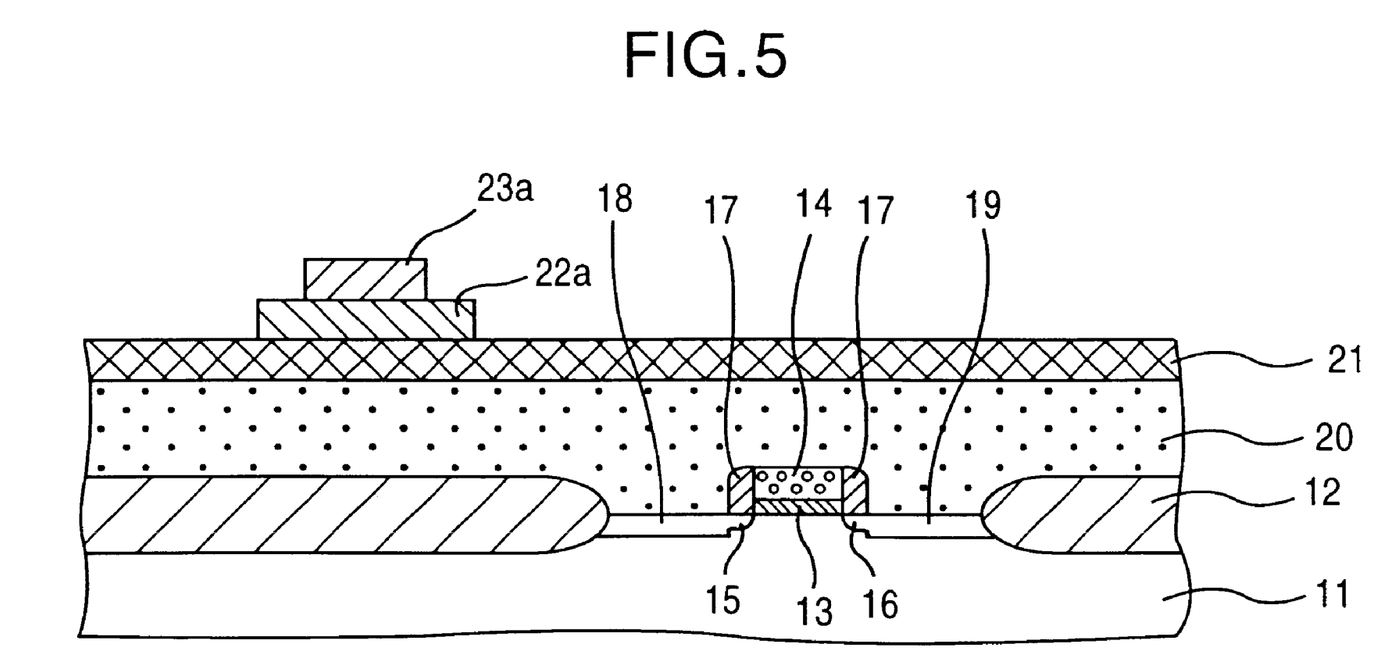
FIG. 5 is a schematic cross-sectional view for explaining the first embodiment of the present invention.

Next, as illustrated in FIG. 5, the resist 25 is removed with the down-flow method using the mixed gas of $CF_4$ and $O_2$. In this case, only the $O_2$ gas may be used for the process but residues of reaction byproduct can easily be removed in the later isolation process by mixing the $CF_4$ gas.

Subsequently, the wetting process is performed for three minutes using an aqueous solution of phosphoric acid in the liquid temperature of 35° C. with a phosphoric acid concentration of 6.1 wt % and thereafter washing in pure water is conducted for 10 minutes. With this process, the reaction byproduct 26 deposited on the side wall or the like can be removed perfectly without any reduction of the film thickness of the capacitor insulation film 22a. The effect of separation can be more improved through simultaneous use of ultrasonic waves at the time of washing with the pure water.

Figure 6:
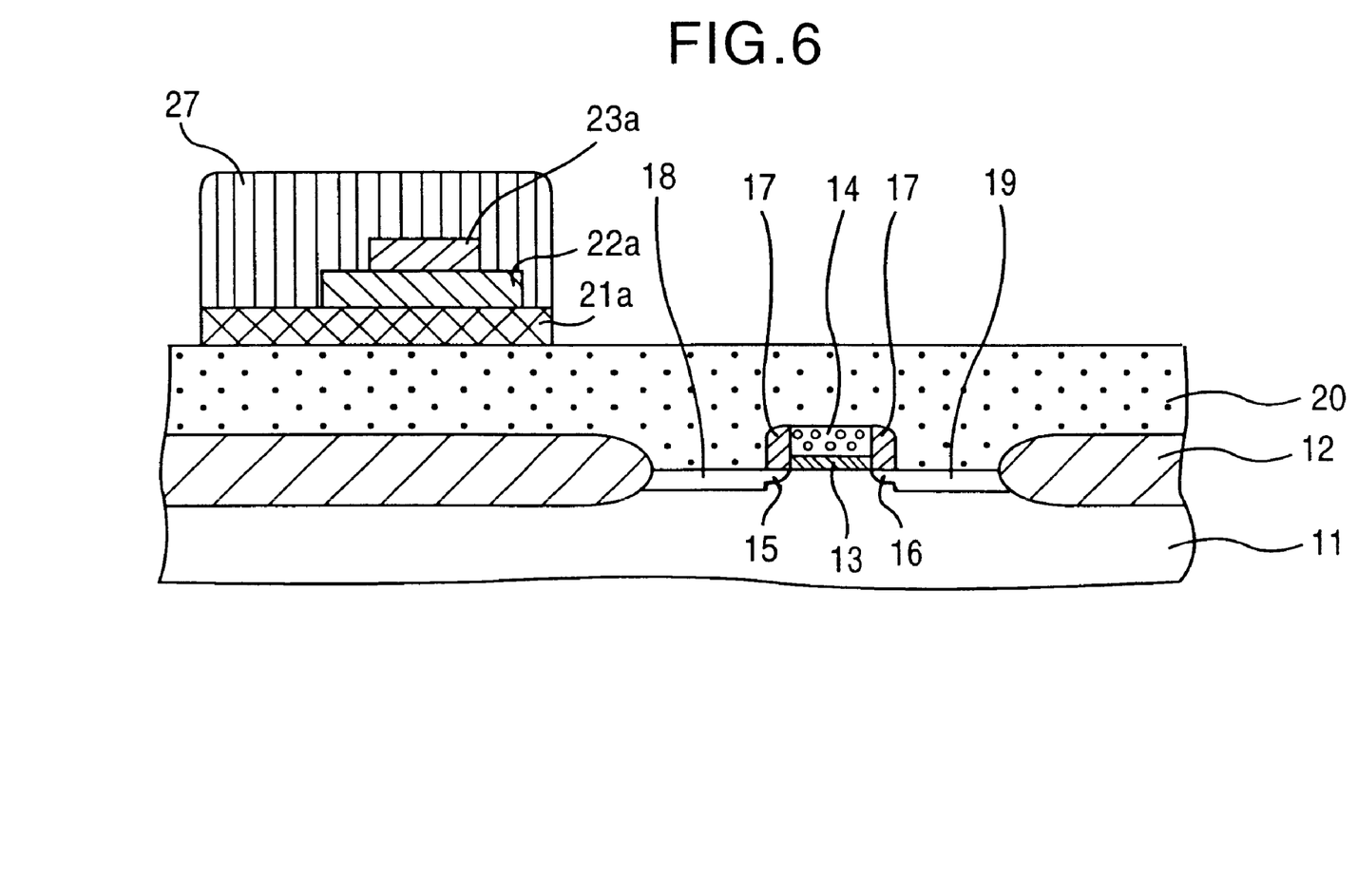
FIG. 6 is a schematic cross-sectional view for explaining the first embodiment of the present invention.

Next, as illustrated in FIG. 6, after the resist 27 is formed leaving the lower electrode forming region, the double-layer structure of Pt and Ti is etched with the dry etching method depending on the RIE method using the mixed gas of Ar and $Cl_2$ in order to form the lower electrode 21a.

Figure 7:
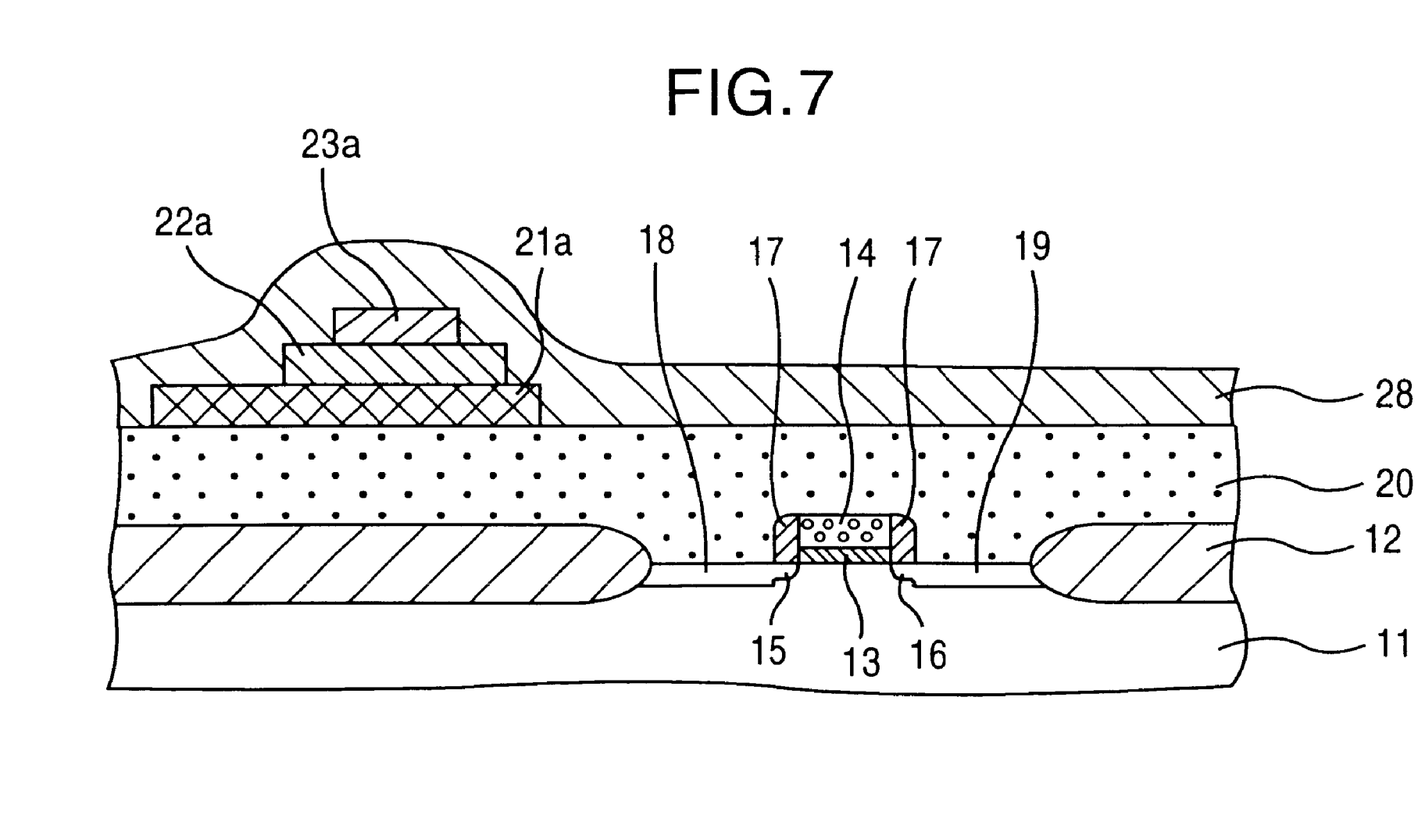
FIG. 7 is a schematic cross-sectional view for explaining the first embodiment of the present invention.

Next, as illustrated in FIG. 7, the resist 27 is removed with the ashing process using the oxygen plasma and thereafter the separation liquid consisting of an organic solvent is used for the separation process.

Subsequently, after the BPSG film 28 is formed with the CVD method on the entire surface, it is then annealed (reflow process) at 700° C. in a nitrogen atmosphere in order to attain a smooth surface.

Figure 8:
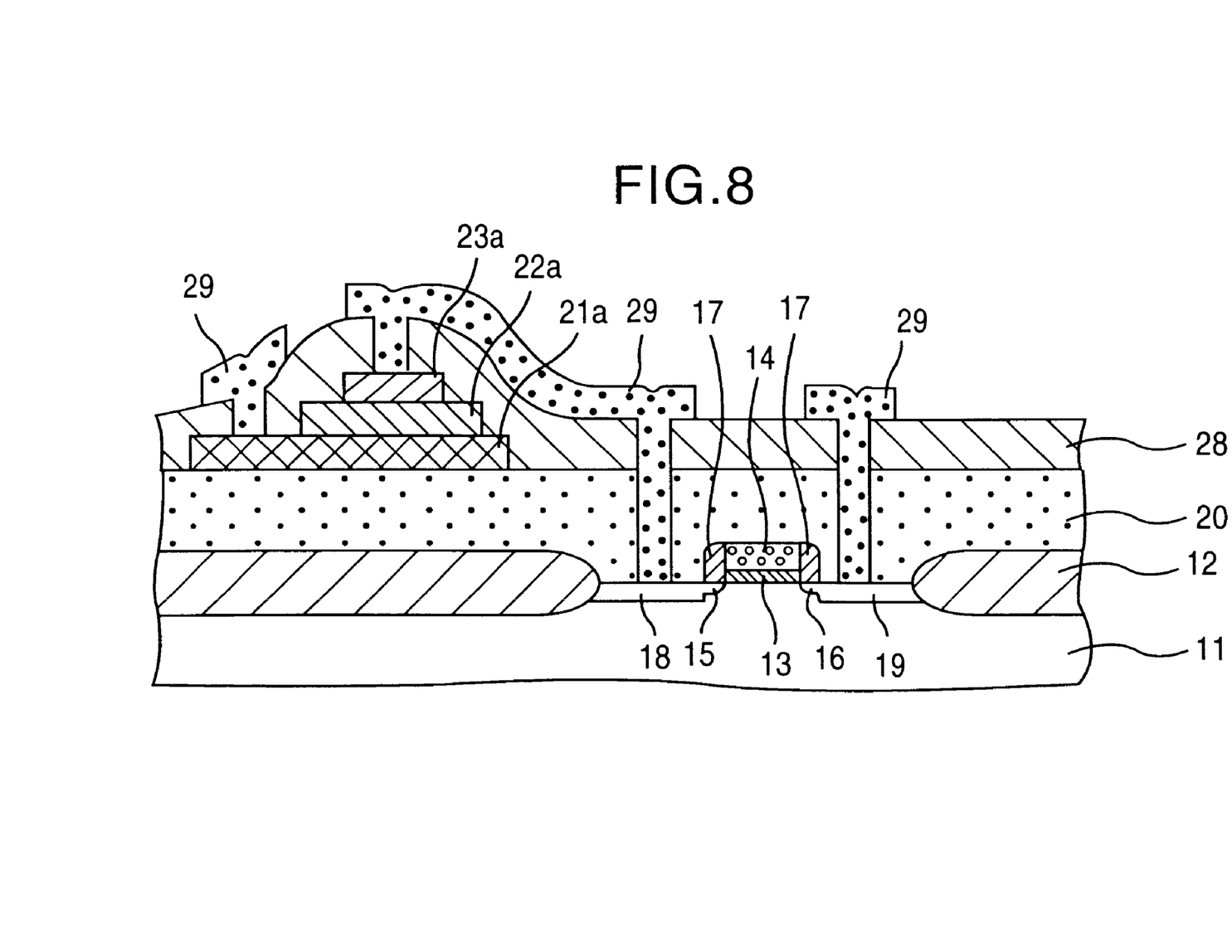
FIG. 8 is a schematic cross-sectional view for explaining the first embodiment of the present invention.

Next, as illustrated in FIG. 8, the BPSG film 28 and CVD oxide film 20 are etched to form a contact hole extending to the lower electrode 21a, upper electrode 23a, and source•drain diffused layers 18, 19.

After the conductive layer in the three-layer structure of Ti, TiN and Al is formed, it is then patterned to form the wiring layer 29.

Although not illustrated, thereafter, an FeRAM is formed through the processes to form the passivation film and open the window on the wiring pad for lead contact.

In the above embodiment, after the etching of the ferro-dielectric material 22, the reaction byproduct may be removed without etching of the ferro-dielectric material with the phosphoric acid wetting process after the ashing of the resist.

In above embodiment, after the etching of the ferro-dielectric material 22, the phosphoric acid wetting process has been performed after the ashing of the resist, but when a large amount of reaction byproduct is deposited, the wetting process may be recommended before and after the ashing of the resist.

Namely, in the resist separation process illustrated in FIG. 4, the PZT film is etched with the resist 25 used as the mask to form the capacitor insulation film 22a. Thereafter, the wetting process is performed for three minutes using the aqueous solution of phosphoric acid at the temperature of 35° C. with phosphoric acid concentration of 6.1 wt % and thereafter washing with the pure water is then performed for 10 minutes.

Subsequently, the resist is separated with the down-flow ashing method using the plasma of mixed gas of $O_2$ and $CF_4$.

Successively, the wetting process is performed for three minutes with the aqueous solution of phosphoric acid at the temperature of 35° C. with phosphoric acid concentration of 6.1 wt % and thereafter washing with pure water is performed for 10 minutes.

As explained above, the reaction byproduct, even when a large amount of byproduct is deposited, may be removed successfully by introducing the wetting process using the aqueous solution of phosphoric acid before and after the ashing process.

As the conditions of the phosphoric acid process, the wetting process has been performed for three minutes using the aqueous solution of phosphoric acid of 35° C. with phosphoric acid concentration of 6.1 wt %, but it is apparent that the process margin such as concentration and liquid temperature may be widened through the use of phosphoric acid. For example, it has been confirmed that the reaction byproduct 26 deposited to the side wall or the like can be removed perfectly without reduction of thickness of the capacitor insulation film 22a even when the wetting process is performed for three minutes using the aqueous solution of phosphoric acid of 35° C. with phosphoric acid concentration of 6.1 wt %. Moreover, liquid temperature may be selected in the range of 20 to 60° C.

In above embodiment, as a method of removing the resist, the plasma of a gas mixture of $O_2$ gas and $CF_4$ gas has been used. However, as explained previously, even when only $O_2$ gas is used, residues of the reaction byproduct may be removed through the phosphoric acid process.

In the embodiment explained above, the $CF_4$ gas is mixed with the $O_2$ gas, but it has been also confirmed that the effect of removing residues of reaction byproduct can be further improved, in comparison with the same effect obtained when only the $O_2$ gas is used, by using the gas including fluorine such as $NF_3$, $SF_6$ and $CHF_3$ gas in place of the $CF_4$ gas.

Figure 9:
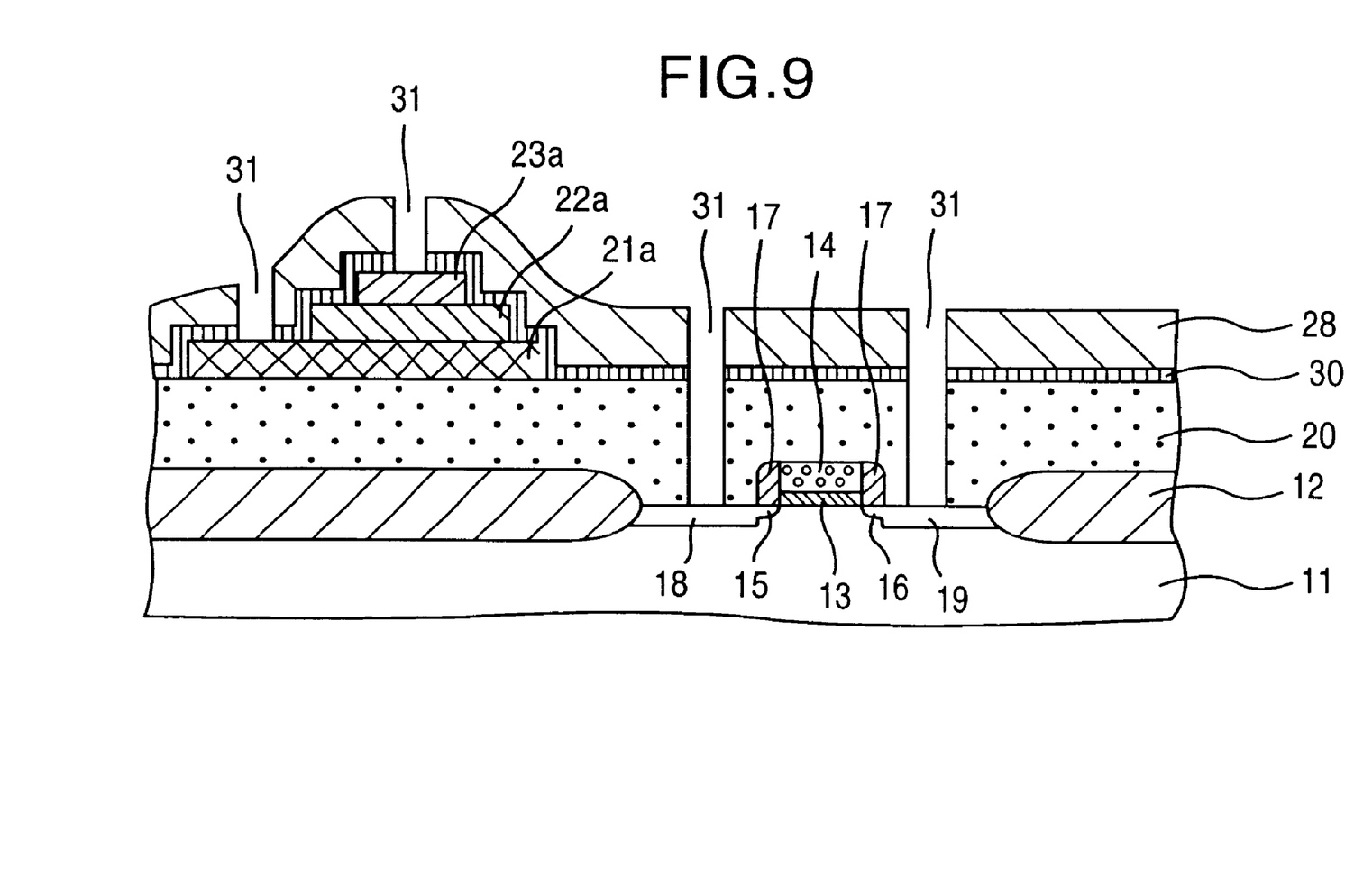
FIG. 9 is a schematic cross-sectional view for explaining the second embodiment of the present invention.

FIG. 9 is a schematic cross-sectional view illustrating the second embodiment of the present invention. In this embodiment, a ferro-dielectric material film 30 is formed to cover the capacitor structure as a protection film between the CVD oxide film 20 and BPSG film 28 illustrated in the first embodiment. The elements like those in the first embodiment are designated with the like reference numerals.

This protection film is provided to prevent the ferro-dielectric material film consisting of a composite oxide film and high dielectric material film from being reduced with the hydrogen atmosphere and thereby the capacitor characteristic is deteriorated at the time of annealing process using the forming gas that is generally conducted in the final stage of forming the element. Therefore, as a film not allowing penetration of hydrogen, a ferro-dielectric material film and high dielectric material film may be used.

The contents that a ferro-dielectric material film and high dielectric material film have sufficient effect as the hydrogen penetration preventing film are described in the Japanese Unexamined Published Patent Application No. HEI 7-111318.

When the ferro-dielectric material film is used as illustrated in FIG. 9 as the protection film, the ferro-dielectric material film 30 must also be etched simultaneously with the etching of the BPSG 28 and CVD oxide film 20 in the contact hole forming process to assure the contact with the source•drain diffused layers 18, 19, lower electrode 21a and upper electrode 23a.

Therefore, even in the process to form the contact hole 31, the reaction byproduct that is generated during the etching of the ferro-dielectric material film 30 must also be removed as explained below.

First, a resist having an opening in the contact hole forming region is formed on the BPSG 28.

Subsequently, the BPSG 28, ferro-dielectric protection film 30 and CVD oxide film 20 are sequentially etched using this resist as a mask. The BPSG 28 and CVD oxide film 20 can be etched using, for example, the mixed gas of $CF_4$ and $O_2$, while the ferro-dielectric protection film 30 can be etched using, for example, the mixed gas of $CF_4$ and Ar.

Thereafter, like the first embodiment, the resist is removed with the down-flow method using the mixed gas of $CF_4$ and $O_2$.

Next, the wetting process is performed for three minutes using the aqueous solution of phosphoric acid in the liquid temperature of 35° C. with phosphoric acid concentration of 6.1 wt % and thereafter washing with pure water is performed for 10 minutes. With these processes, the reaction byproduct adhered to the side wall of the contact hole or the like can be removed perfectly without depressing the ferro-dielectric material film 30 within the contact hole 31.

Like the first embodiment, the effect of the separation process can further be improved by simultaneously using ultrasonic waves at the time of washing with the pure water. When a large amount of reaction byproduct is deposited, it is recommended to perform the phosphoric acid process before and after the ashing of the resist.

The present invention is not limited to the memory cell structure explained in the above embodiment and the present invention can also be applied to the cell structure using a plug between the source•drain diffused layer and lower electrode and to various electrode structures such as Ir, $IrO_2$, Ru, $RuO_2$, Ta or the like.

Moreover, the present invention can also be applied to the other ferro-dielectric material films such as PLZT film ((Pb, Ln) (Zr, Ti)$O_3$) and SBT film ($SrBi_2(Ta, Nb)_2O_9$) in addition to PZT film.

What is claimed:

1. A method of manufacturing a semiconductor device having a ferro-dielectric material film, comprising the steps of:

forming a ferro-dielectric material film above a semiconductor substrate;

etching said ferro-dielectric material film; and wetting, after said etching process, said semiconductor substrate with aqueous solution of phosphoric acid, wherein said wetting using aqueous solution of phosphoric acid is performed after ashing a resist used in etching said ferro-dielectric material.

2. A method of manufacturing a semiconductor device having the ferro-dielectric material film as claimed in claim 1, wherein said etching is performed by a dry-etching method.

3. A method of manufacturing a semiconductor device having the ferro-dielectric material film as claimed in claim 1, wherein said etching uses a resist as a mask and said wetting using aqueous solution of phosphoric acid is performed before and after the resist is ashed.

4. A method of manufacturing a semiconductor device having the ferro-dielectric material film as claimed in claim 1, wherein said ashing of the resist is performed using a mixed gas including fluorine and oxygen.

5. A method of manufacturing a semiconductor device having the ferro-dielectric material film as claimed in claim 1, wherein the ferro-dielectric material film is a capacitor insulation film.

6. A method of manufacturing a semiconductor device having the ferro-dielectric material film as claimed in claim 1, wherein the ferro-dielectric material film is a protected film to prevent diffusion of hydrogen and the etching of the ferro-dielectric material film is performed simultaneously with the etching of an inter-layer insulation film.

7. A method of manufacturing a semiconductor device having the ferro-dielectric material film as claimed in claim 4, wherein the gas including fluorine is selected from the group consisting of $CF_4$, $NF_3$, $SF_6$ and $CHF_3$.

8. A method of manufacturing a semiconductor device having a ferro-dielectric material film as claimed in claim 1, further comprising applying ultrasonic waves in the wetting step.

9. A method of manufacturing a semiconductor device having the ferro-dielectric material film as claimed in claim 1, wherein the aqueous solution of phosphoric acid in the wetting step is applied in a temperature range of 20 to 60° C.

10. A method of manufacturing a semiconductor device having the ferro-dielectric material film as claimed in claim 1, wherein the ferro-dielectric material film is selected from the group consisting of PZT and PLZT.

* * * * *